United States Patent

Saitoh et al.

[11] Patent Number: 5,844,915
[45] Date of Patent: Dec. 1, 1998

[54] METHOD FOR TESTING WORD LINE LEAKAGE IN A SEMICONDUCTOR MEMORY DEVICE

[75] Inventors: Yoritaka Saitoh; Shunichi Sukegawa, both of Tsukuba; Makoto Saeki, Hamura; Yukihide Suzuki, Akishima, all of Japan

[73] Assignee: Texas Instruments Incorporated, Dallas, Tex.

[21] Appl. No.: 716,080

[22] Filed: Sep. 19, 1996

[30] Foreign Application Priority Data

Sep. 19, 1995 [JP] Japan ................................. 7-239696

[51] Int. Cl.[6] .................................................. G11C 29/00
[52] U.S. Cl. .......................................... 371/21.2; 371/21.4
[58] Field of Search .................................. 371/21.2, 21.4, 371/21.1; 365/200, 201, 220; 324/76.11

[56] References Cited

U.S. PATENT DOCUMENTS

| 4,004,222 | 1/1977 | Gebhard | 324/158 R |
| 4,896,322 | 1/1990 | Kraus et al. | 371/21.2 |
| 5,117,426 | 5/1992 | McAdams | 371/214 |
| 5,610,867 | 3/1997 | DeBrosse et al. | 365/201 |

*Primary Examiner*—Hoa T. Nguyen
*Attorney, Agent, or Firm*—William B. Kempler; Richard L. Donaldson

[57] ABSTRACT

A word line leak check test for a semiconductor memory arranged as a matrix which includes word lines and y-selection lines. First, a RAS signal is enabled while a prescribed row address is input, and word line 22 is driven to the Vpp level. Then, when the CAS signal is enabled, the voltage source is disconnected from word line 22, and word line 22 floats. Two bits for the column address are disregarded, and the Y selection signal line 23 is decoded without those 2 bits. By this means, 4 y-selection signal lines 23 are simultaneously enabled. When this condition has been maintained for a prescribed time T, a delayed write operation is conducted, and then it is determined whether the data has been correctly stored in memory cell 24.

6 Claims, 3 Drawing Sheets

METHOD FOR TESTING WORD LINE LEAKAGE IN A SEMICONDUCTOR MEMORY DEVICE

FIELD OF INVENTION

The present invention concerns a method for testing semiconductor devices such as DRAMs.

BACKGROUND OF THE INVENTION

High integration levels for semiconductor memory devices, such as DRAMs, have continued with advancements in microfabrication technology of recent years, which have been put to practical use, as with for example, high-capacity 64 Mb memory chips. In order to prevent defects in this type of DRAM, various operational tests are conducted.

The design of this DRAM and one such test, the word line leak check test, is explained with reference to FIG. 5.

In FIG. 5, the memory cell is shown in a configuration in which it is divided into an upper array block 11 and lower array block 12, and each block is further divided into memory blocks 13-1 to 13-4. Also, in this type of DRAM, the input address is decoded when the prescribed memory cell 24 of the prescribed memory block is selected by means of word line 22 and Y selection signal line 23, and reading/writing of the data is performed. Since the memory cells of a plurality of memory blocks are selected at one time, data of the desired bit length can be simultaneously input and output.

Ordinarily, in this type of a DRAM when the RAS signal is enabled the selected word line 22 is driven to the Vpp level (the array voltage level+2 V) and must be held at that voltage level until the RAS signal is disabled. In other words, if it is assumed that the word line 22 is short circuited, its voltage drops, and the reading/writing of data cannot take place. The detection of the short circuit (leak) at this word line 22 constitutes the word line leak check test.

Because the selected word line 22 is at a higher potential than any other node within the array block, if there was a high-resistance shunt to another node, leakage of the word line 22 would be difficult to discover in a short time.

Thus, if the RAS signal is enabled, and the selected word line 22 rises to the Vpp level, the power source that supplies the Vpp level to the word line 22 is disconnected from the word line 22, and the word line 22 floats. Then, after a sufficient time T has passed data is written to the memory cell 24 associated with that word line 22 by means of a delayed write. If the word line 22 is short-circuited to another node and the potential of the word line 22 drops below the level at which a signal can be written to the memory cell during the above-mentioned time T, a sufficient signal level cannot be written to the cell, and the defect is not discovered until the time that the data of that cell is read.

However, not only was this type of word line leak check test simply a check which only performed the reading/writing operations, but because a prescribed time T was absolutely necessary for one test cycle, it also had the problem that a large amount of time was required for the test. Specifically, when the memory capacity became large, as in a 64 Mb DRAM, the test time became a very great problem.

Therefore, the purpose of the present invention is to offer a testing method for semiconductor memory devices that can conduct the word line leak check test in a short amount of time.

SUMMARY OF INVENTION

As for the word line leak check tests used until now, since only a single Y selection signal line could be selected for the word line that is being selected from the respective memory blocks, in order to conduct a test of all the Y selection signal lines, it was necessary to repeat the number of RAS cycles by exactly the number of columns. Thus, during a single RAS cycle, a number of Y selection signal lines 23 were simultaneously placed in the enabled condition (selected condition) in order to simultaneously test a number of memory cells.

Therefore, the semiconductor memory device testing method of the present invention has a plurality of memory cells in a matrix configuration, so that the desired memory cells are selected by means of the word line and Y selection signal lines arranged essentially in rows and columns corresponding to the said matrix, and the reading and writing of data is performed, where the desired voltage is applied from a voltage source to the given selected word line; after the above-mentioned voltage application, the electrical connection between the above-mentioned voltage source and the above-mentioned word line is removed; and after the passage of a given period of time, a plurality of memory cells are simultaneously placed in the selected condition by means of a plurality of Y selection signal lines, and data is simultaneously written to the given plurality of memory cells; and then the data of the above-mentioned memory cells in which data was written is read, and checked.

Ideally, by disregarding the prescribed number of bits of the address signal for the purpose of selecting the memory cell, a plurality of Y selection signal lines are simultaneously selected.

DESCRIPTION OF EMBODIMENTS

An embodiment of the semiconductor memory device testing method of the present invention will be explained with reference FIGS. 1 to 4.

Figure 1:
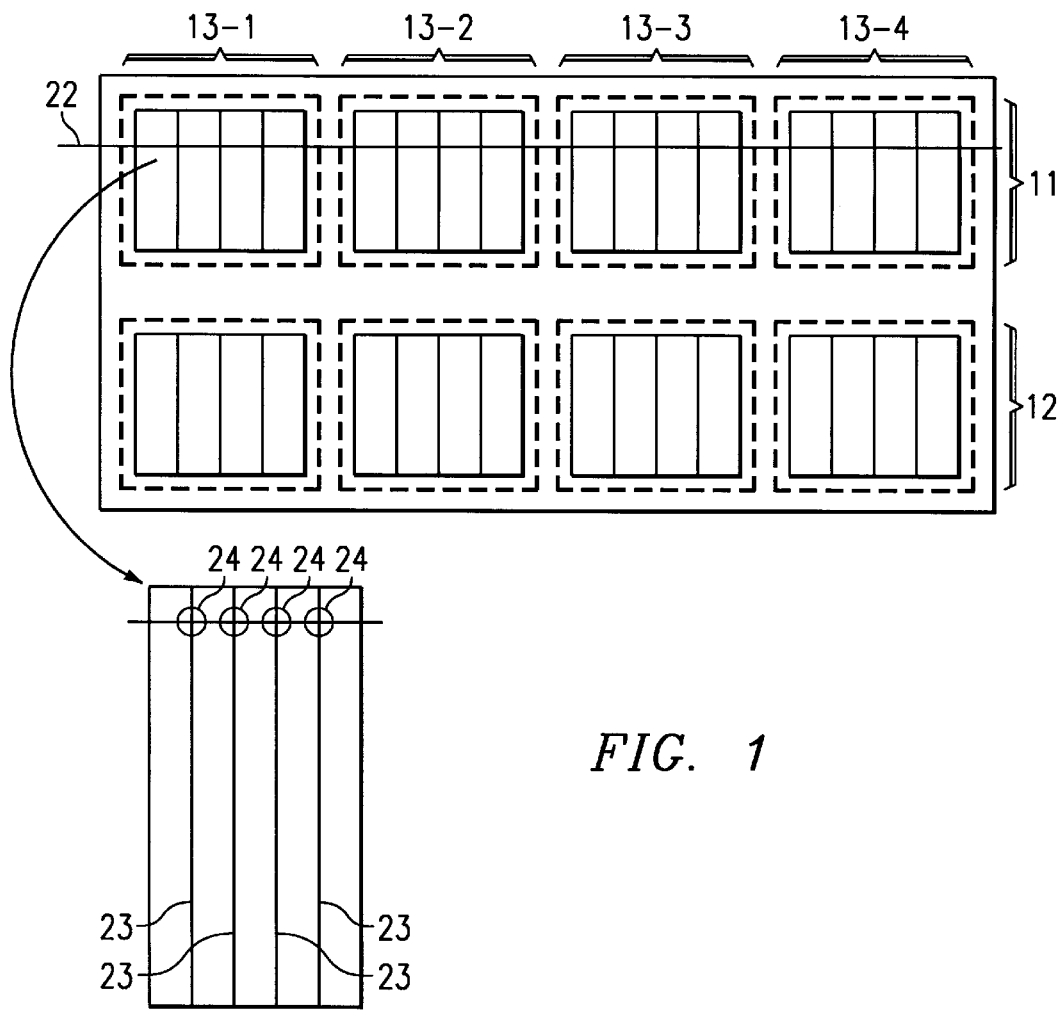
FIG. 1 is a diagram showing a method for a word line leak check test of the present invention.

FIG. 1 is a diagram showing a word line leak check test of the present invention.

Figure 2:
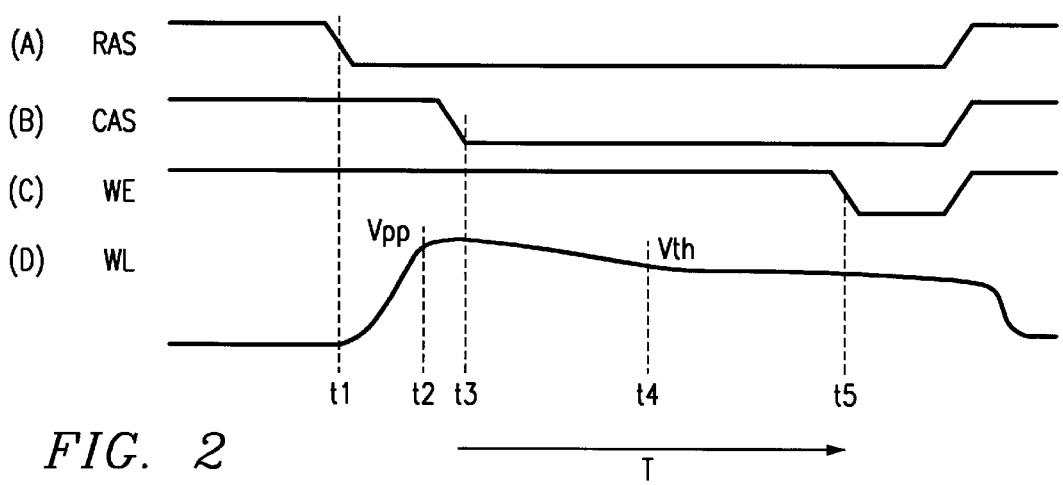
FIG. 2 is a timing diagram for the purpose of explaining the word line leak check test.

FIG. 2 is a timing diagram for the purpose of explaining the word line leak check test.

Figure 3:
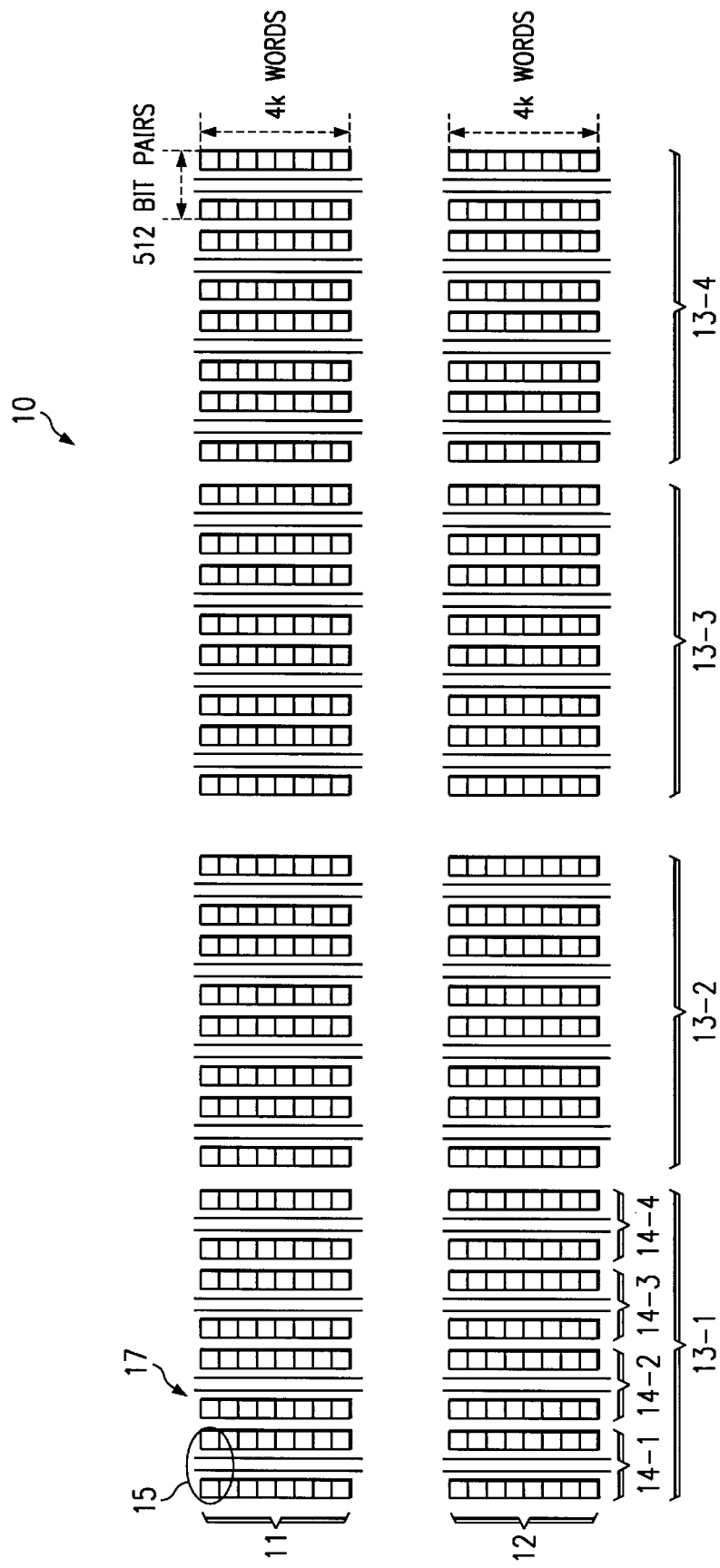
FIG. 3 is a drawing showing an example of the embodiment of the memory array of a 64 Mb×4 DRAM.

FIG. 3 is a diagram showing an example of the construction of a memory array of a 64 Mb×4 DRAM.

Figure 4:
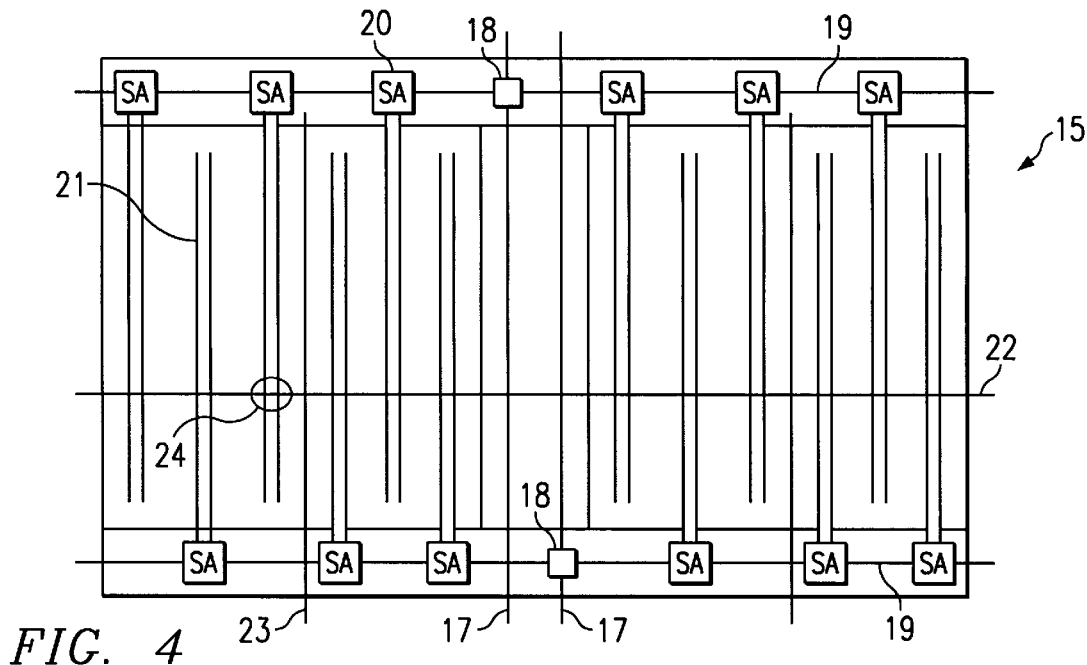
FIG. 4 is a drawing showing the design of a subarray of the memory array shown in FIG. 3 in greater detail.
Figure 5:
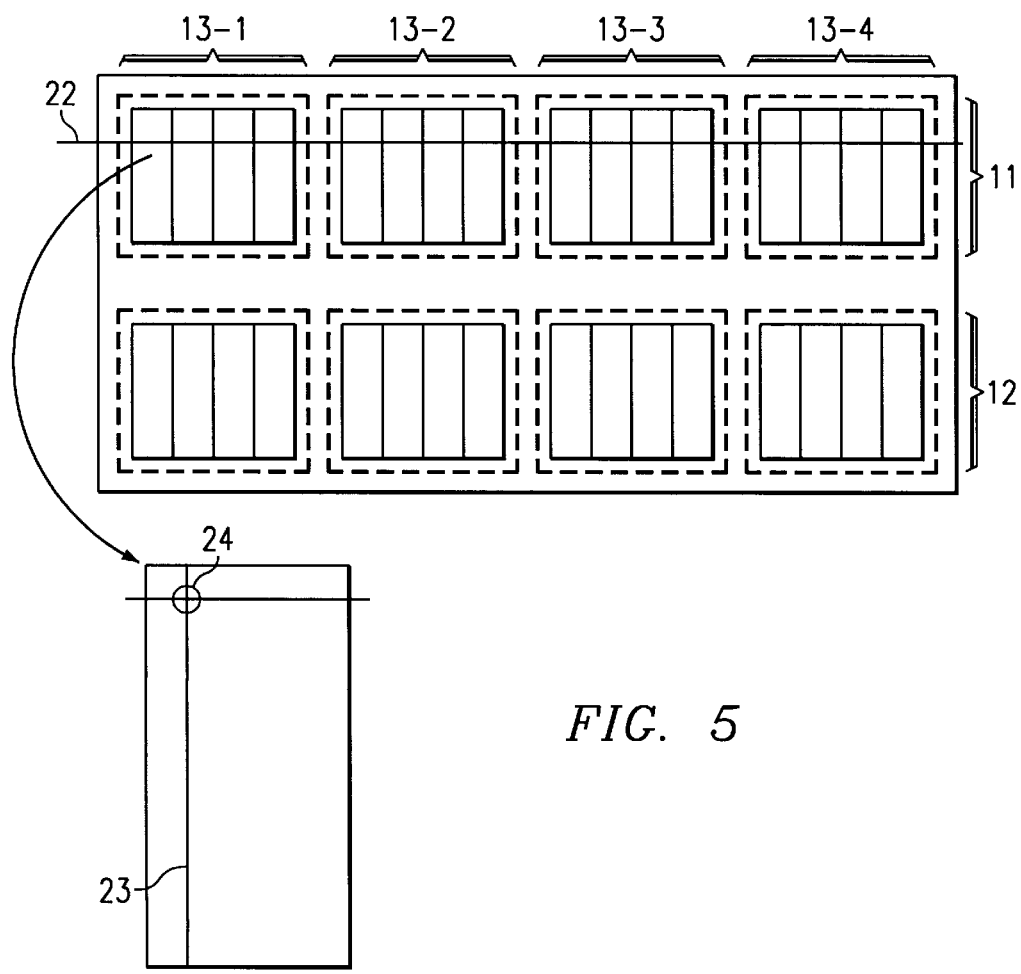
FIG. 5 is a drawing showing the method for a word line leak check test used until now.

FIG. 4 is a drawing showing the construction of the subarray 15 of the memory array shown in FIG. 3 in greater detail.

First, the construction of the DRAM that is referenced in the configuration of the present embodiment is explained with reference to FIGS. 3 and 4.

The memory array 10 shown in FIG. 3 is constructed in matrix form, and the memory cells having a storage memory capacity of 1 bit are arranged in rows and columns.

In this type of memory array, the entire body of the array is divided into the upper array block 11 and the lower array block 12, and each array block is divided into memory blocks 13-1 to 13-4, each consisting of 8 Mbs, corresponding to the bit length of the input and output data. Further, each memory block 13-1 to 13-4 is constructed of 4 subblocks 14-1 to 14-4. Main I/O (MI/O) lines 17 are provided in a two-line pair configuration to each subblock 14-1 to 14-4, and the input and output of data to each subblock 14-1 to 14-4 is conducted by means of these MI/O 17. Therefore, the data on a total of 16 lines of MI/O 17 is conveniently selected for the memory blocks in the upper array block 11 and the lower array block 12, and finally becomes I/O data of 1 bit.

8 local I/O (LI/O) lines 19 are connected to each MI/O 17 by means of I/O switches 18; 256 sense amplifiers 20 are provided at each respective LI/O 19, and finally, 512 memory cells are connected to each sense amplifier 20 by means of bit lines 21. The bit lines 21 from the sense amplifiers 20 that are connected to the LI/O 19 are successively connected to the memory cells that are arranged in matrix form by being assembled in the comb form, as shown in FIG. 4, and the subarrays 15 are constructed of the 256 Kbit section memory cells (512 memory cells×256 sense amplifiers×2 LI/O).

In this way, a single subblock 14 is constructed of 8 subarrays 15.

Also, in this type of DRAM, based on the decoder results for the input row and column addresses, a convenient word line 22 and Y selection signal line 23 are enabled, and memory cell 24 is selected. Then, data input and output is conducted between the MI/O 17 and the memory cell by means of the enabled sense amplifier 20 and I/O switch 18.

Next, the word line leak check test of the present invention is explained with reference to FIG. 1 and FIG. 2.

In the test mode condition, first, while the prescribed row address is input, the RAS signal is enabled, as shown in FIG. 2(A), i.e., it goes low. When this is done, for example, word line (WL) 22 is selected, as shown in FIG. 1, and as shown in FIG. 2(D), that word line 22 is driven to the Vpp level (array voltage level+2 V).

Next, as shown in FIG. 2(B), when the CAS signal is enabled, i.e., it goes low, the voltage source that has driven the word line 22 to the above-mentioned Vpp level is disconnected from the word line 22, and the word line 22 floats. This state is then maintained for a prescribed time T, for example, several msec. At this time, the 2 bits that form the column address are disregarded, and the Y selection signal line 23 is decoded at the address that has been accepted by those 2 bits. As a result, as shown in FIG. 1, the 4 Y selection signal lines 23 are simultaneously enabled, and the 4 memory cells 24 are selected from the already-selected word lines 22.

After a prescribed time T has passed, while the prescribed data to the DRAM data line is input as shown in FIG. 2(C), the write enable (WE) signal goes low, and the delayed write operation is conducted.

If there is no leak (short circuit) in word line 22 and it operates normally, the input data is written into the 4 memory cells 24 shown in FIG. 1.

Then, by means of the normal read operation, the above-mentioned 4 memory cells 24 are successively read, and it is determined whether the data that has been read is the same as the input data.

If there is a leak (short circuit) in word line 22 during the above-mentioned prescribed time T, for example, at time t4 of FIG. 2, because the potential of the word line 22 has dropped below the necessary level Vth for writing the data, the delayed write is not conducted at the following time t5, and the read data and input data do not match.

Thus, all of the leaks (short circuits) of this word line 22 that are the object of the test can be detected.

In this way, in the word line leak check test of the configuration of this embodiment, 4 Y selection signal lines 23 are simultaneously enabled, and data can be simultaneously written to the 4 memory cells 24 that have been selected by means of those 4 Y selection signal lines 23. During the word line leak check test, since the prescribed time T during which the word line 22 floats includes almost the entire test time, the test time thereby can be reduced by almost ¼.

The semiconductor memory device testing method of the present invention is not limited to the configuration of this embodiment, and various improvements are possible.

For example, in the embodiment of this embodiment, the number of memory cells to which data is simultaneously written is determined by simultaneously enabling 4 Y selection signal lines 23 (for the entire DRAM, this becomes 4 lines X the number of bits per word), but the invention is not limited to enabling 4 lines; more than 4 lines may be enabled.

Also, during the data check, with the constitution of this embodiment, the words in which the data is written are checked by being read sequentially, but the data bits can be compressed and checked at one time.

In the embodiment of the present invention, during the test mode the embodiment is such that when a single address is input, a prescribed number of subblocks of the Y selection signal lines 23 as mentioned above, in other words, sense amplifiers 20, are enabled. However, this is only set so that the connections of the decoder section that are supplied in the original DRAM will operate in this manner; another method can be easily adopted. Therefore, in the constitution of this embodiment, an explanation of the design of the decoder section has been omitted.

In a semiconductor memory device testing method of the present invention, since the data for a number of memory cells can be simultaneously written, the word line leak check test can be conducted at high speed and in a short time.

In the figures, 10 represents a memory array, 11 an upper array block, 12 a lower array block, 13 a memory block, 15 a subarray, 17 an MI/O, 18 an I/O switch, 19 an LI/O, 20 a sense amplifier, 21 a bit line, 22 a word line, 23 a Y selection signal line, 24 a memory cell, 25 a block selector, 26 a main amplifier, 27 an MA selector, 28 and 30 a CB driver, 29 a compression circuit, 30 a CB driver, and 31 a NAND element.

We claim:

1. A method for testing a semiconductor memory device having a plurality of memory cells that are arranged essentially in a matrix form which includes word lines and y-selection signal lines arranged essentially in rows and columns, respectively, and wherein desired memory cells of the plurality of memory cells are selected by enabling one of said word lines and at least one of said plurality of y-selection signal lines, the method comprising the steps of:

applying a desired voltage from a voltage source to said one of said word lines by electrically connecting the voltage source to the one of said word lines;

removing, after the step of applying, the electrical connection between the voltage source and the one of said word lines;

after a predetermined period of time from the applying step, enabling said y-selection signal line for selecting a plurality of memory cells and writing data into the selected plurality of memory cells; and reading from the selected plurality of memory cells the written data and checking the read-out data.

2. The method of claim 1, further comprising the step of:

selecting a plurality of y-selection signal lines by disregarding a predetermined number of bits of an address signal when selecting a plurality of memory cells.

3. A method for testing a semiconductor memory device having a plurality of memory cells that are arranged essentially in a matrix form which includes word lines and y-selection signal lines arranged essentially in rows and columns, respectively and wherein desired memory cells of the plurality of memory cells are selected by enabling one of said word lines and at least one of said plurality of y-selection signal lines, the method comprising the steps of:

applying a desired voltage from a voltage source to said one of said word lines by electrically connecting the voltage source to the one of said word lines;

removing after the step of applying, the electrical connection between the voltage source and the one of said word lines;

after a predetermined period of time from the applying step, enabling said y-selection signal line for substantially simultaneously selecting a plurality of memory cells and then writing data into the selected plurality of memory cells; and reading from the selected plurality of memory cell the written data and checking the read-out data.

4. The method of claim 3, further comprising the step of: selecting a plurality of y-selection signal lines substantially simultaneously by disregarding a predetermined number of bits of an address signal when selecting a plurality of memory cells.

5. A method for testing a semiconductor memory device having a plurality of memory cells that are arranged essentially in a matrix form which includes word lines and y-selection signal lines arranged essentially in rows and columns, respectively and wherein desired memory cells of the plurality of memory cells are selected by enabling one of said word lines at least one of said and plurality of y-selection signal lines, the method comprising the steps of:

reading data from the selected desired memory cells and writing data into the selected desired memory cells;

applying a desired voltage from a voltage source to said one of said word lines by electrically connecting the voltage source to the one of said word lines;

removing, after the step of applying, the electrical connection between the voltage source and the one of said word lines;

after a predetermined period of time from the applying step, enabling said y-selection signal line for substantially simultaneously selecting a plurality of memory cells and then writing data into the selected plurality of memory cells; and reading from the selected plurality of memory cell the written data and checking the read-out data.

6. The method of claim 3, further comprising the step of: selecting a plurality of y-selection signal lines substantially simultaneously by disregarding a predetermined number of bits of an address signal when selecting a plurality of memory cells.

* * * * *